(12) United States Patent
Kurashima et al.

(10) Patent No.: US 10,732,367 B2
(45) Date of Patent: Aug. 4, 2020

(54) HIGH-FREQUENCY MODULE

(71) Applicant: FUJITSU COMPONENT LIMITED, Tokyo (JP)

(72) Inventors: Shigemi Kurashima, Tokyo (JP); Mitsuki Kanda, Tokyo (JP); Takatoshi Yagisawa, Tokyo (JP); Masahiro Yanagi, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 16/199,456

(22) Filed: Nov. 26, 2018

(65) Prior Publication Data

US 2019/0219781 A1 Jul. 18, 2019

(30) Foreign Application Priority Data

Jan. 16, 2018 (JP) .................. 2018-004606

(51) Int. Cl.
  *G02B 6/42* (2006.01)
  *H05K 9/00* (2006.01)
  *H01Q 17/00* (2006.01)

(52) U.S. Cl.
  CPC ......... *G02B 6/4292* (2013.01); *H05K 9/0058* (2013.01); *H05K 9/0084* (2013.01); *H01Q 17/002* (2013.01); *H01Q 17/008* (2013.01)

(58) Field of Classification Search
  CPC .. G02B 6/4292; H05K 9/0084; H01Q 17/008; H01Q 17/002
  See application file for complete search history.

(56) References Cited

U.S. PATENT DOCUMENTS

| 7,948,760 | B2 * | 5/2011 | Kawauchi | ............ G02B 6/4246 361/749 |
| 8,714,840 | B2 | 5/2014 | Matsue et al. | |
| 9,035,199 | B2 * | 5/2015 | Janota | .................. H05K 9/0007 174/355 |
| 2007/0241962 | A1 * | 10/2007 | Shinoda | .................. G01S 7/032 342/361 |

FOREIGN PATENT DOCUMENTS

JP 2013-069883 4/2013

* cited by examiner

*Primary Examiner* — Ryan A Lepisto
(74) *Attorney, Agent, or Firm* — IPUSA, PLLC

(57) ABSTRACT

A high-frequency module includes a first board on which an electronic device is mounted, a second board on which at least wiring is formed, and a radio-wave absorber disposed between the first board and the second board. Multiple slits are formed in the radio-wave absorber.

3 Claims, 11 Drawing Sheets

HIGH-FREQUENCY MODULE

CROSS-REFERENCE TO RELATED APPLICATION

The present application is based on and claims priority to Japanese Patent Application No. 2018-004606, filed on Jan. 16, 2018, the entire contents of which are incorporated herein by reference.

BACKGROUND OF THE INVENTION

1. Field of the Invention

An aspect of this disclosure relates to a high-frequency module.

2. Description of the Related Art

Electric cables made of, for example, copper have been used for communications performed by supercomputers and high-end servers via high-speed interfaces. However, optical communication is becoming popular to achieve high-speed signal transmission and to increase the transmission distance.

Next generation interfaces with a long transmission distance of dozens of meters employ optical communication technologies, and use optical modules to connect optical cables to servers. An optical module converts an optical signal into an electric signal, and converts an electric signal into an optical signal.

An optical module includes a light emitter, a light receiver, a driving integrated circuit (IC) for driving the light emitter, and a trans-impedance amplifier (TIA) for converting an electric current into a voltage. The light emitter, the light receiver, the driving IC, and the TIA are mounted on a board. The light emitter and the light receiver are connected to a ferrule such as a lens ferrule via an optical waveguide (see, for example, Japanese Laid-Open Patent Publication No. 2013-069883).

SUMMARY OF THE INVENTION

In an aspect of this disclosure, there is provided a high-frequency module that includes a first board on which an electronic device is mounted, a second board on which at least wiring is formed, and a radio-wave absorber disposed between the first board and the second board. Multiple slits are formed in the radio-wave absorber.

BRIEF DESCRIPTION OF THE DRAWINGS

FIG. 4 is a graph illustrating frequency characteristics observed while an optical module is powered on;

DESCRIPTION OF EMBODIMENTS

An electromagnetic wave may be generated as noise when the optical module using a high-frequency electric signal is actuated. The electromagnetic wave may influence the electric signal and decrease the reception sensitivity of the optical module. This problem also occurs in an optical module using a high-frequency optical signal.

For the above reasons, in a high-frequency module using a high-frequency optical signal or a high-frequency electric signal, it is desired to reduce the influence of noise during operation and prevent the decrease in reception sensitivity.

Embodiments of the present invention are described below with reference to the accompanying drawings. Throughout the drawings, the same reference number is assigned to the same component, and repeated descriptions of the same component are omitted.

Figure 1:
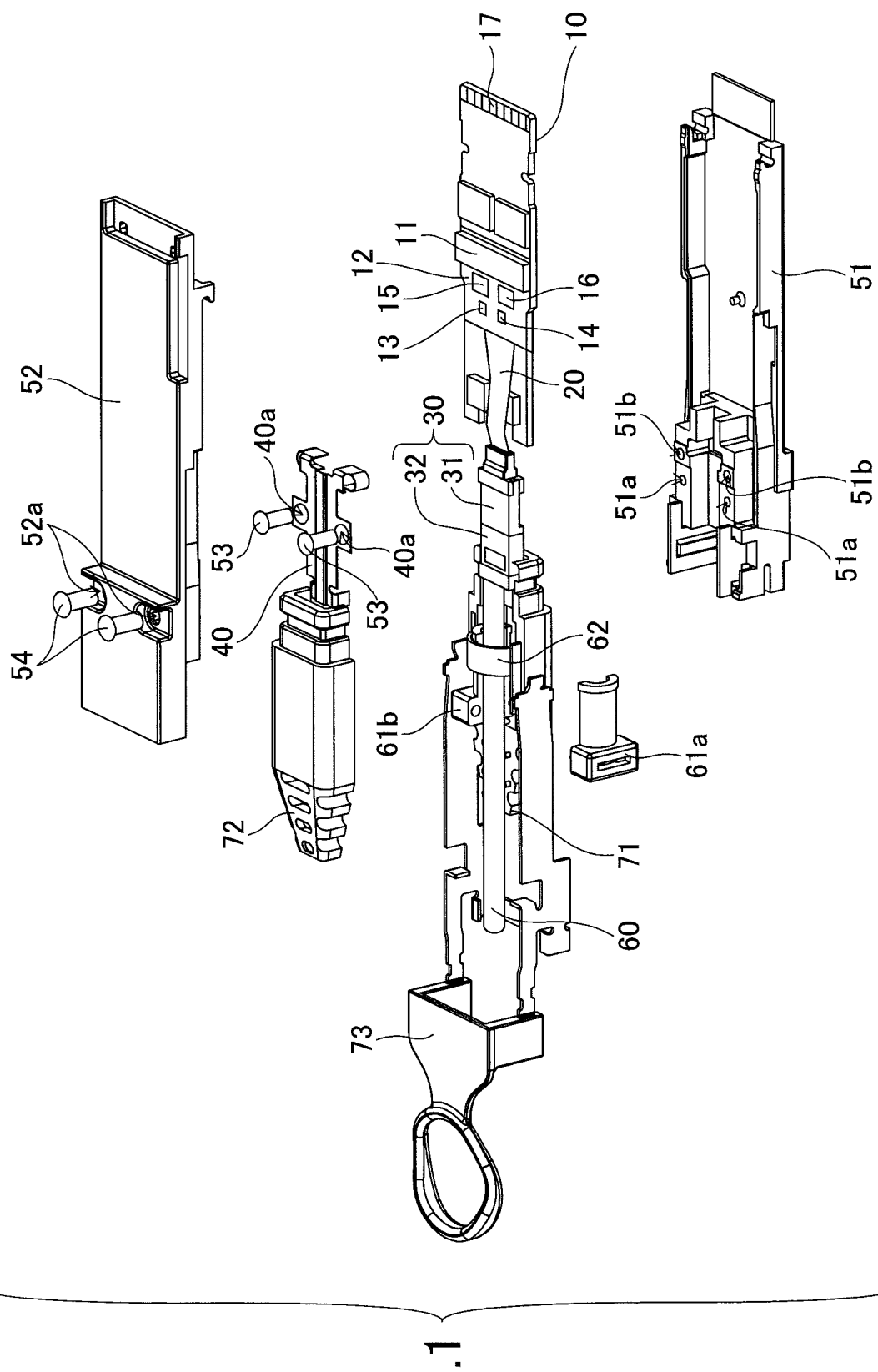
FIG. 1 is an exploded perspective view of an optical module.

As an example of a high-frequency module according to an embodiment, an optical module using a high-frequency optical signal is described below with reference to FIG. 1. FIG. 1 is an exploded perspective view of the optical module.

The optical module of FIG. 1 includes a circuit board 10, an optical waveguide 20, an optical connector 30, and a clip 40 that are housed in a housing formed by a lower housing 51 and an upper housing 52. An optical cable 60 is connected to the optical module. A part of the optical cable 60 is covered by the housing.

The circuit board 10 includes a flexible printed-circuit (FPC) connector 11 to which an FPC board 12 is connected. A light emitter 13 such as a vertical cavity surface emitting laser (VCSEL) that converts an electric signal into an optical signal, a light receiver 14 such as a photodiode that converts an optical signal into an electric signal, a driving IC 15 for driving the light emitter 13, and a TIA 16 that converts an electric current output from the light receiver 14 into a voltage are mounted on the FPC board 12. The circuit board 10 includes a terminal 17 for connecting an external device. Each of the light emitter 13 and the light receiver 14 may be referred to as a "photoelectric transducer", the driving IC 15 may be referred to as a "driving circuit", and the TIA 16 may be referred to as a "conversion circuit".

The optical waveguide 20 is formed like a flexible sheet, and includes multiple cores surrounded by clads. Light entering the optical waveguide 20 propagates through the cores.

The optical connector 30 includes a lens ferrule 31 and an MT ferrule 32 that are connected to each other and held together by the clip 40.

The optical waveguide 20 is connected to the lens ferrule 31. Screw holes 40a formed in the clip 40 are aligned with screw holes 51a of the lower housing 51, and the clip 40 is screwed to the lower housing 51 with screws 53 to fix the optical connector 30 to the lower housing 51.

Sleeves 61a and 61b are fixed by a crimp ring 62 to the optical cable 60. A portion of the optical cable 60 to which the sleeves 61a and 61b are fixed is covered by upper and lower cable boots 71 and 72, and a pull-tab/latch 73 is attached to the cable boots 71 and 72.

The optical connector 30 is fixed via the clip 40 to the lower housing 51, the upper housing 52 is placed on the lower housing 51 on which the circuit board 10 is placed, and screws 54 are screwed into screw holes 52a of the upper housing 52 and screw holes 51b of the lower housing 51 to fix the upper housing 52 to the lower housing 51.

Figure 2:
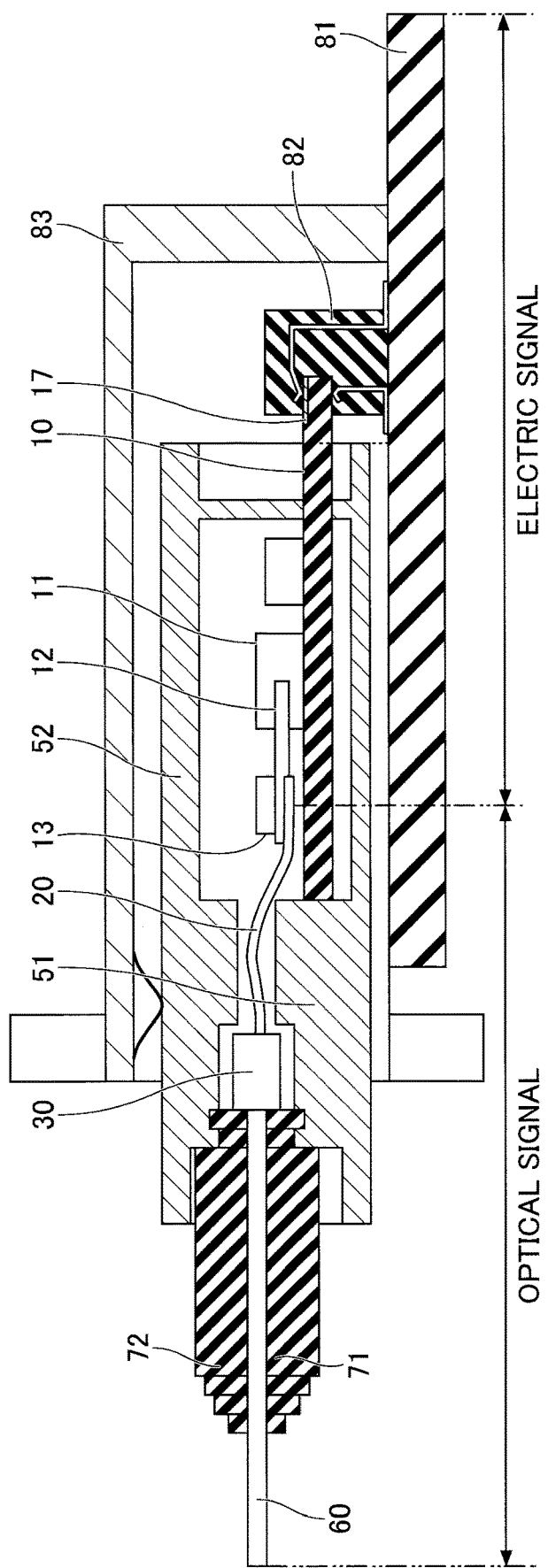
FIG. 2 is a drawing illustrating a configuration of an optical module.

As illustrated in FIG. 2, the terminal 17 is inserted into a connector 82 of a board 81 of an external device, and the optical module is thereby connected to the connector 82. A cage 83 is provided to cover the optical module connected to the connector 82. The lower housing 51, the upper housing 52, and the cage 83 are formed of a metal.

Figure 3:
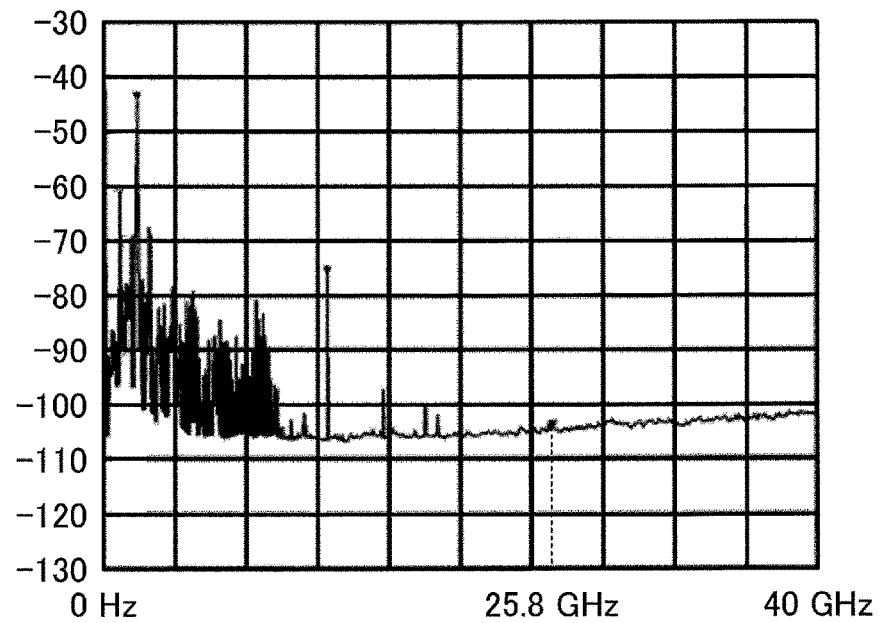
FIG. 3 is a graph illustrating frequency characteristics observed while an optical module is powered off.
Figure 4:
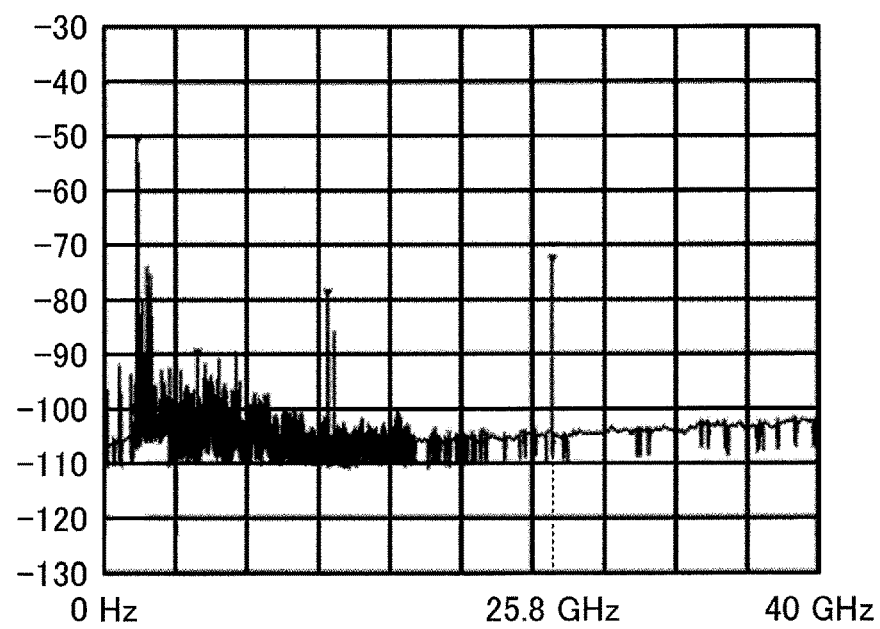

When the optical module is actuated, an electromagnetic wave is generated. FIGS. 3 and 4 illustrate frequency characteristics that are obtained by measuring electromagnetic waves leaking from the optical module using an antenna disposed near an end of the optical module closer to the optical cable 60. FIG. 3 illustrates frequency characteristics observed while the optical module is powered off, and FIG. 4 illustrates frequency characteristics observed while the optical module is powered on. Comparing FIGS. 3 and 4, when the optical module is powered on, noise is generated at a frequency of about 25.8 GHz, and the intensity of the electromagnetic wave is −73.5 dBm. Here, the optical module uses a frequency of about 12.5 GHz, and 25.8 GHz is about two times greater than 12.5 GHz.

Figure 5:
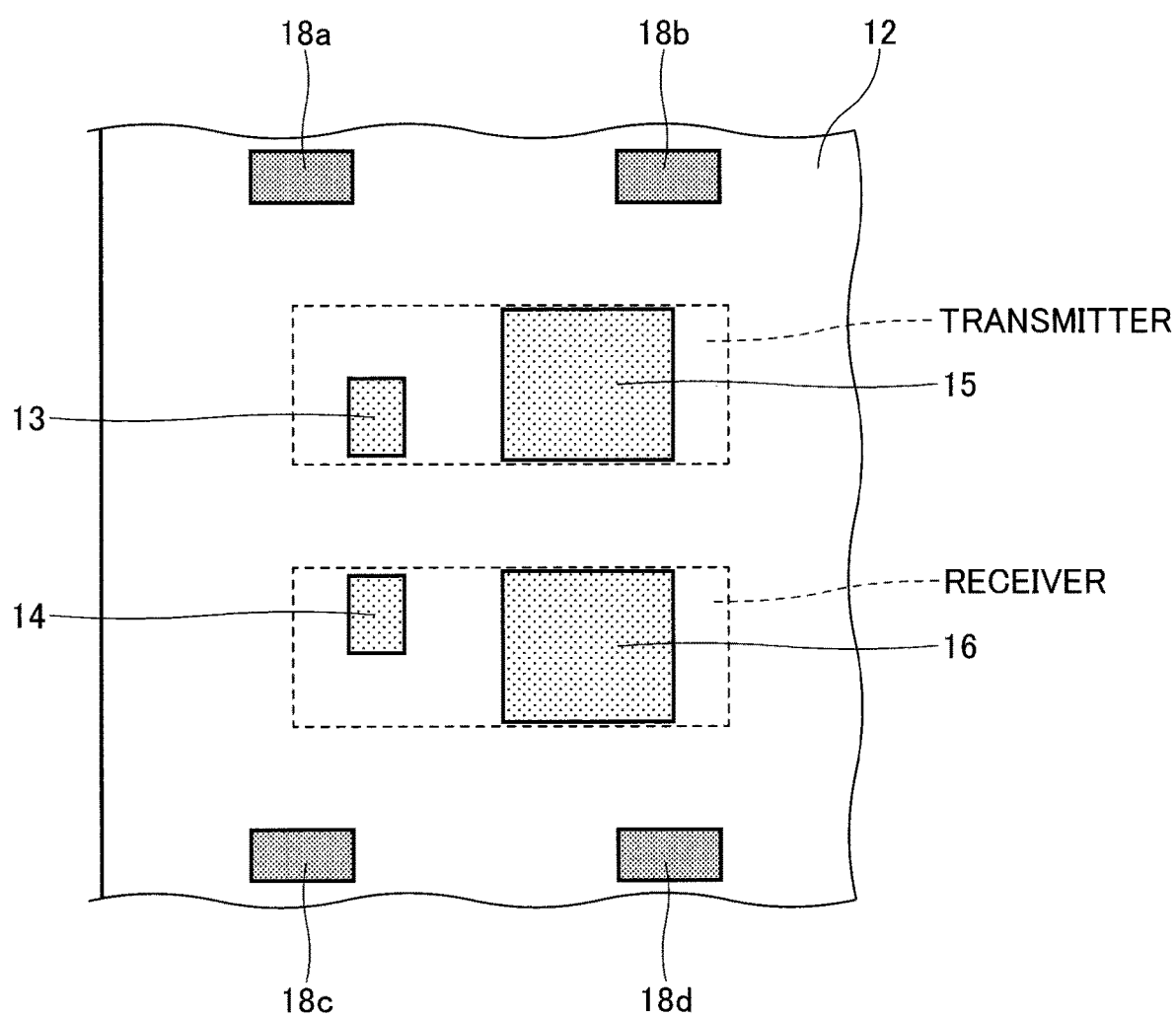
FIG. 5 is a drawing illustrating an arrangement of a light emitter and a light receiver of an optical module.

As illustrated in FIG. 5, multiple capacitors 18a, 18b, 18c, and 18d are provided around the light emitter 13, the light receiver 14, the driving IC 15, and the TIA 16 mounted on the FPC board 12. The light emitter 13 and the driving IC 15 form a transmitter of an optical engine, and the light receiver 14 and the TIA 16 form a receiver of the optical engine. Because a comparatively-large current flows through the transmitter to drive the light emitter 13, electromagnetic waves are generated at the light emitter 13 and the driving IC 15. The generated electromagnetic waves may become noise that influences electric signals flowing through wiring on the circuit board 10 facing the FPC board 12 and may reduce reception sensitivity.

<Simulations>

Simulations conducted using two planar antennas called patch antennas are described.

Figure 6A:
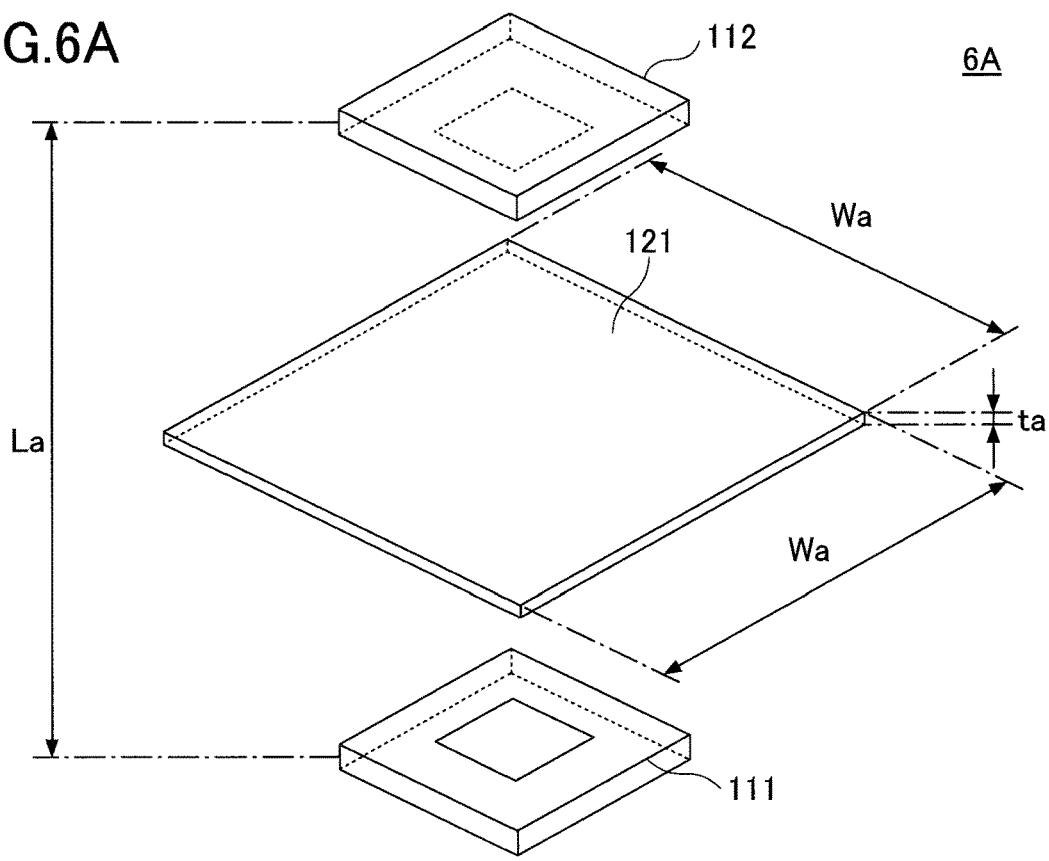
FIGS. 6A and 6B are drawings illustrating simulation models.
Figure 6B:
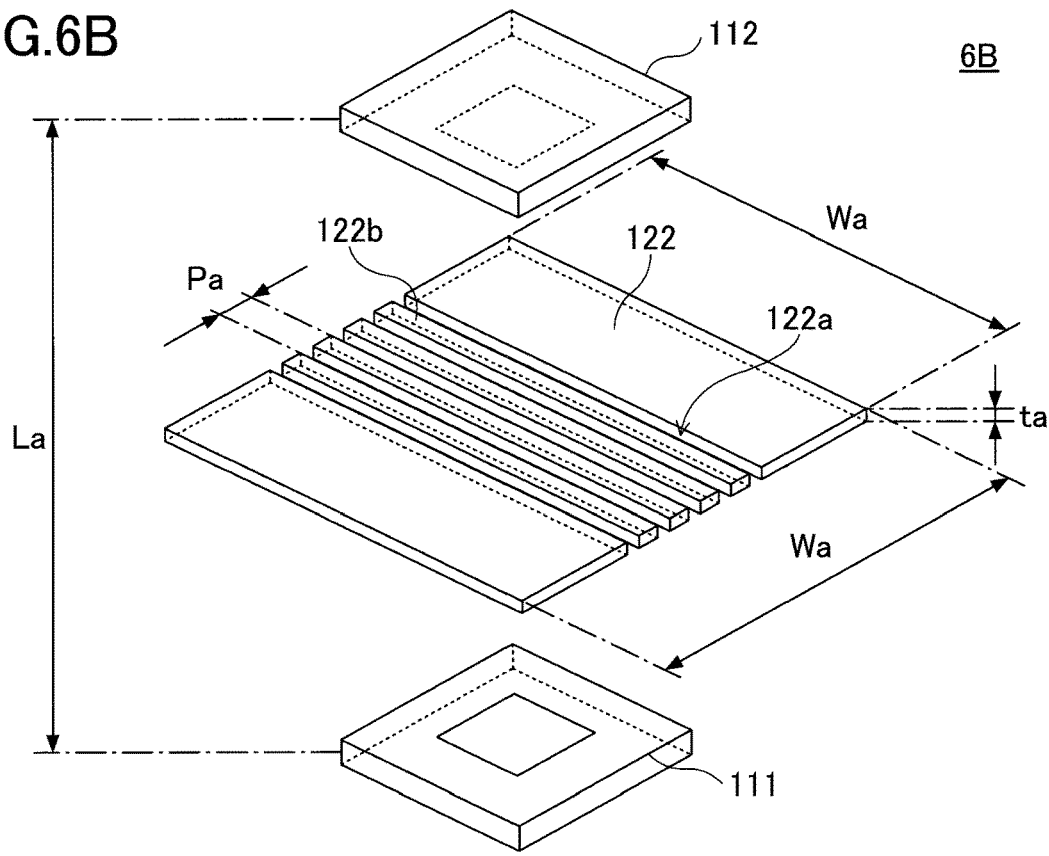

FIG. 6A illustrates a model 6A where a radio-wave absorbing sheet 121 is provided between the antenna 111 and the antenna 112, and FIG. 6B illustrates a model 6B where a radio-wave absorbing sheet 122 with slits is provided between the antenna 111 and the antenna 112.

In the simulations, as illustrated in FIGS. 6A and 6B, a radio wave emitted by an antenna 111 is received by an antenna 112, and a transmission characteristic S21 is obtained based on the power of the emitted radio wave and the power of the received radio wave.

The transmission characteristic S21 is calculated for each of models 6A and 6B. A distance La between the antenna 111 and the antenna 112 is 30 mm. The absorbing sheet 121 has a thickness ta of 0.5 mm and each side of which has a width Wa of 30 mm. The absorbing sheet 122 has a thickness ta of 0.5 mm and each side of which has a width Wa of 30 mm. Thirteen slits 122a with a width of 0.1 mm are formed in the absorbing sheet 122. A pitch Pa between the slits 122a is 1 mm, and strip areas 122b are defined by the slits 122a. For brevity, the number of the slits 122a and the number of the strip areas 122b illustrated in FIG. 6B are less than their actual numbers.

Figure 7:
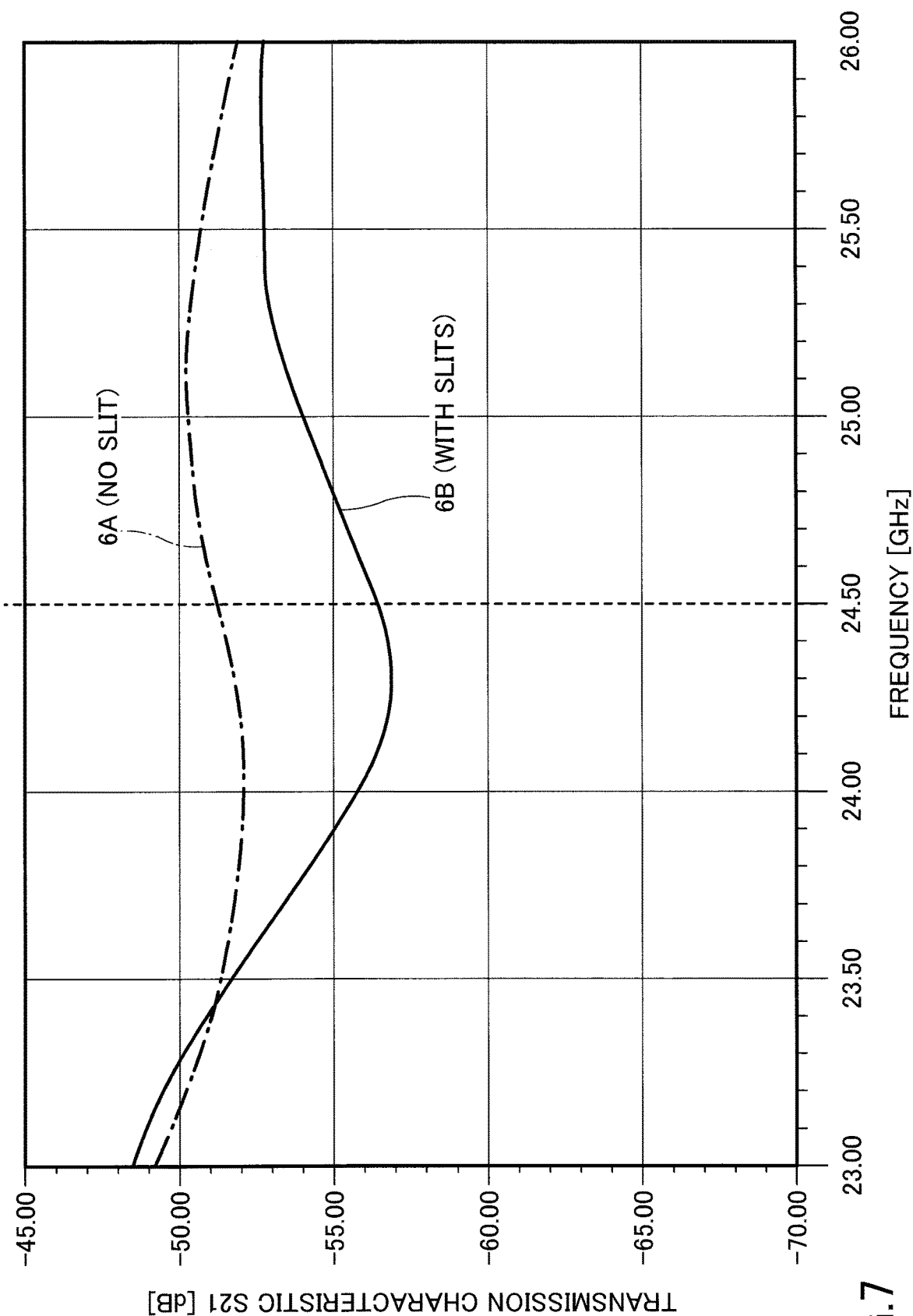
FIG. 7 is a graph illustrating transmission characteristics of simulation models.

FIG. 7 is a graph illustrating transmission characteristics S21 of the models 6A and 6B. As illustrated in FIG. 7, in the model 6A where the absorbing sheet 121 is provided between the antenna 111 and the antenna 112, the transmission characteristic S21 is −51.2 dB at a frequency of 24.5 GHz. On the other hand, in the model 6B where the absorbing sheet 122 is provided between the antenna 111 and the antenna 112, the transmission characteristic S21 is −56.5 dB at a frequency of 24.5 GHz. Table 1 indicates the results of the simulations.

TABLE 1

| TRANSMISSION CHARACTERISTICS | 6A | 6B |
|---|---|---|
| NUMBER OF SLITS | NO SLIT | 13 |
| TRANSMISSION CHARACTERISTIC S21 AT 24.5 GHz | −51.2 dB | −56.5 dB |
| DIFFERENCE FROM 6A | — | 5.3 dB |

As indicated by Table 1, at a frequency of 24.5 GHz, the model 6B can reduce the transmission characteristic S21 by 5.3 dB compared with the model 6A using the absorbing sheet 121 with no slit. As the transmission characteristic S21 decreases, the electromagnetic wave causing noise decreases. Providing the absorbing sheet 122 between the antenna 111 and the antenna 112 can reduce the transmission characteristic S21 by about 6 dB at a frequency around 24.5 GHz.

Figure 8:
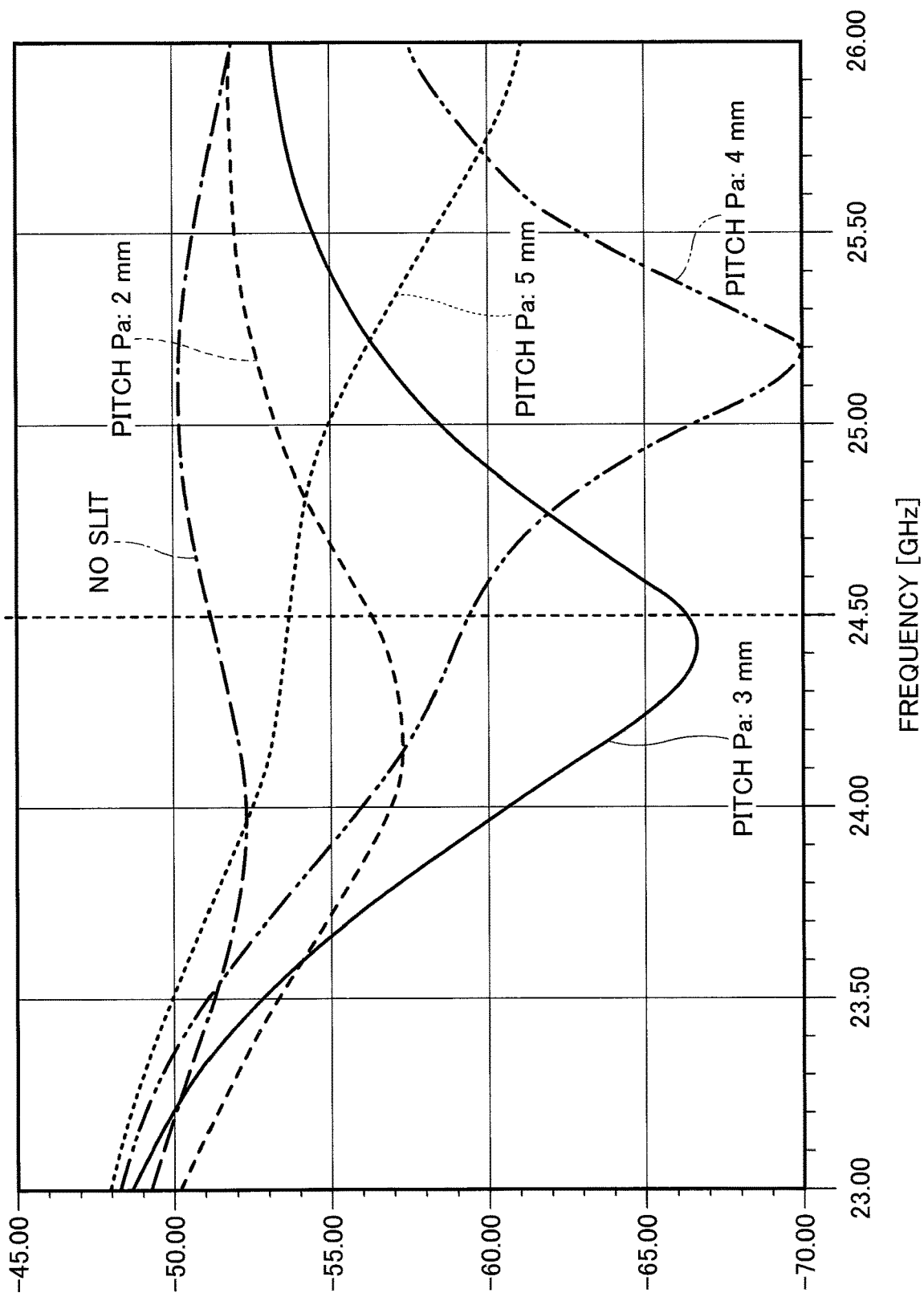
FIG. 8 is a graph illustrating transmission characteristics of simulation models.

Simulations conducted by changing the pitch Pa between the slits 122a are described. Simulations are conducted for cases where the pitch Pa between the slits 122a is set at 2 mm, 3 mm, 4 mm, and 5 mm, respectively. In the simulations, it is assumed that the width of each slit 122a is 0.5 mm, and the number of the slits 122a is five. FIG. 8 is a graph illustrating transmission characteristics S21 observed when the pitch Pa between the slits 122a is set at 2 mm, 3 mm, 4 mm, and 5 mm, respectively. FIG. 8 also illustrates a transmission characteristic in a comparative example where no slit is formed. As illustrated in FIG. 8, at a frequency of 24.5 GHz, the transmission characteristic S21 when the pitch Pa is 2 mm is −56.2 dB, the transmission characteristic S21 when the pitch Pa is 3 mm is −66.1 dB, the transmission characteristic S21 when the pitch Pa is 4 mm is −59.1 dB, and the transmission characteristic S21 when the pitch Pa is 5 mm is −53.6 dB. Table 2 indicates the results of the simulations.

TABLE 2

| PITCH Pa | NO SLIT | 2 mm | 3 mm | 4 mm | 5 mm |
|---|---|---|---|---|---|
| TRANSMISSION CHARACTERISTIC S21 AT 24.5 GHz | −51.2 dB | −56.2 dB | −66.1 dB | −59.1 dB | −53.6 dB |

TABLE 2-continued

| PITCH Pa | NO SLIT | 2 mm | 3 mm | 4 mm | 5 mm |
|---|---|---|---|---|---|
| DIFFERENCE FROM "NO SLIT" | — | 5.0 dB | 14.9 dB | 7.9 dB | 2.4 dB |

As indicated by Table 2, compared with the case using the absorbing sheet 121 with no slit, the transmission characteristic S21 at the frequency of 24.5 GHz is reduced by 5.0 dB when the pitch Pa is 2 mm, reduced by 14.9 dB when the pitch Pa is 3 mm, reduced by 7.9 dB when the pitch Pa is 4 mm, and reduced by 2.4 dB when the pitch Pa is 5 mm. Thus, the transmission characteristic S21 at 24.5 GHz is most effectively reduced when the pitch Pa is set at 3 mm.

An electromagnetic wave with a frequency of 24.5 GHz has a wavelength λ of about 12 mm, and the 3 mm pitch Pa corresponds to about λ/4. Thus, noise can be most effectively reduced by setting the pitch Pa between the slits 122a at about one fourth of the wavelength λ of an electromagnetic wave that causes the noise. According to FIG. 8 and Table 2, the pitch Pa between the slits 122a is preferably greater than or equal to 2 mm and less than or equal to 5 mm, and more preferably greater than or equal to 2 mm and less than or equal to 4 mm. In terms of the wavelength λ of the electromagnetic wave with a frequency of 24.5 GHz, the pitch Pa between the slits 122a is preferably greater than or equal to 0.16λ and less than or equal to 0.41λ, and more preferably greater than or equal to 0.16λ and less than or equal to 0.33λ.

<Optical Module>

Figure 9:
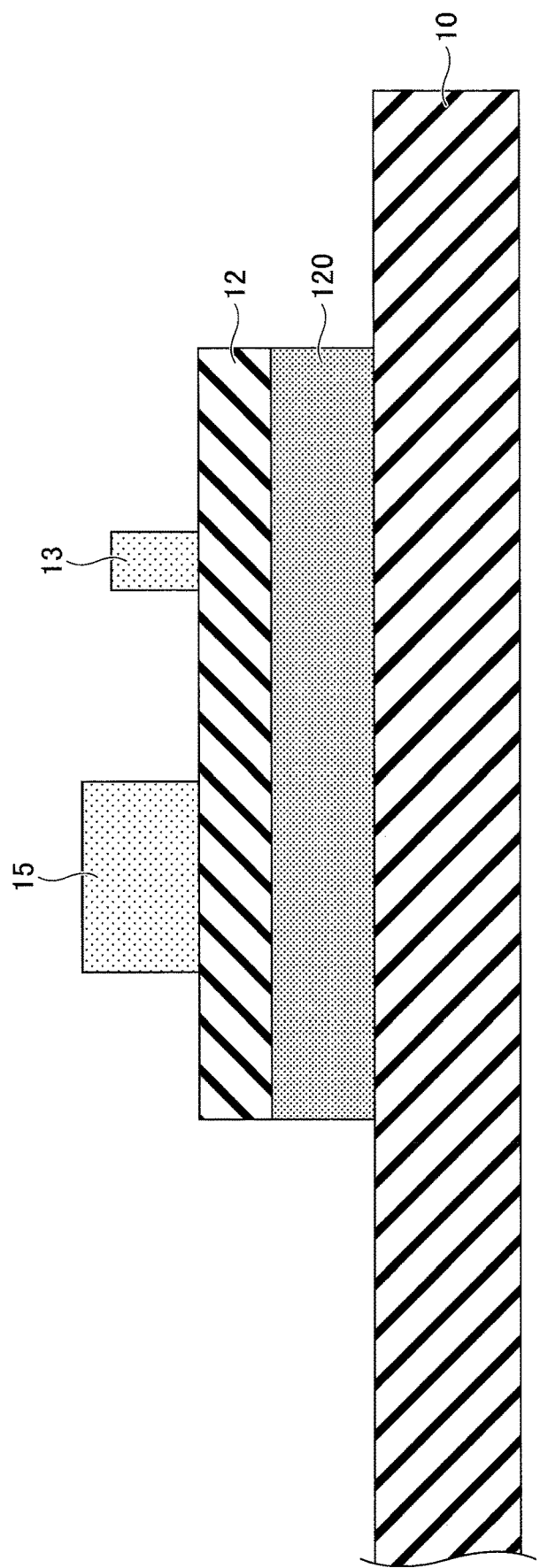
FIG. 9 is a drawing illustrating a configuration of an optical module according to an embodiment.
Figure 10:
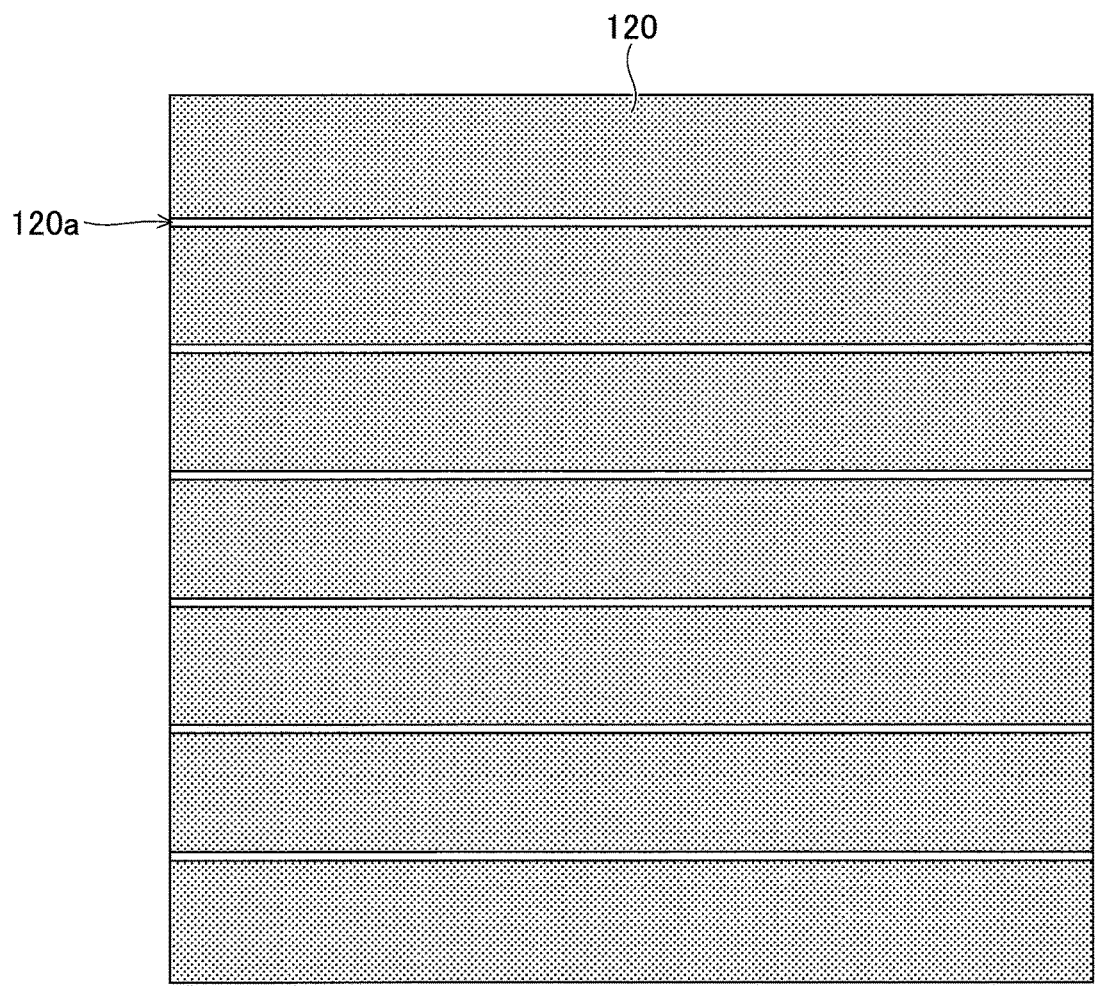
FIG. 10 is a top view of a radio-wave absorber.

The optical module according to the present embodiment is described. As illustrated in FIG. 9, the optical module of the present embodiment has a configuration where a radio-wave absorber 120 having multiple slits 120a is provided between the FPC board 12 and the circuit board 10. FIG. 10 is a top view of the absorber 120.

The absorber 120 is formed of a material such as ferrite that absorbs electromagnetic waves, and is attached to the circuit board 10 or the FPC board 12 using, for example, a double-sided tape. The absorber 120 is preferably formed of a material whose electromagnetic-wave absorption rate increases as the frequency of the electromagnetic wave becomes closer to 25 GHz. For example, BRS-1 of Emerson & Cuming Microwave Products may be used for the absorber 120.

By providing the absorber 120 with the slits 120a between the FPC board 12 and the circuit board 10, parts of electromagnetic waves generated at the light emitter 13, the light receiver 14, the driving IC 15, and the TIA 16 are absorbed by the absorber 120. This configuration can reduce noise components entering wiring on the circuit board 10 and prevent the decrease in reception sensitivity. The slits 120a have a width of 0.65 mm and are arranged at a pitch of about 3 mm.

Figure 11:
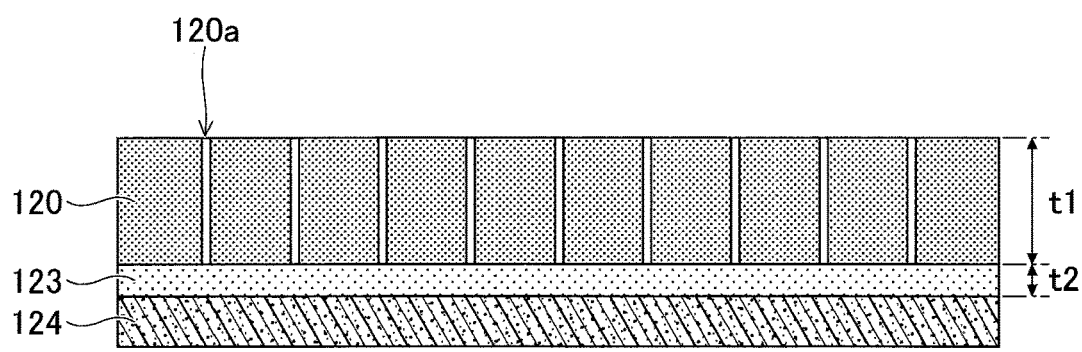
FIG. 11 is a drawing illustrating a radio-wave absorber.

In the present embodiment, as illustrated in FIG. 11, a double-sided tape 123 is attached to one side of the absorber 120, and a release tape 124 is attached to a side of the tape 123 that is opposite the side facing the absorber 120. The slits 120a are formed by cutting the absorber 120 with a slitter after attaching the tape 123 to the absorber 120. Then, the release tape 124 is removed from the tape 123, and the absorber 120 is attached to the circuit board 10 or the FPC board 12 by attaching the tape 123 to the circuit board 10 or the FPC board 12. The absorber 120 has a thickness t1 of about 0.25 mm, and the tape 123 has a thickness t2 of about 0.1 mm.

Figure 12A:
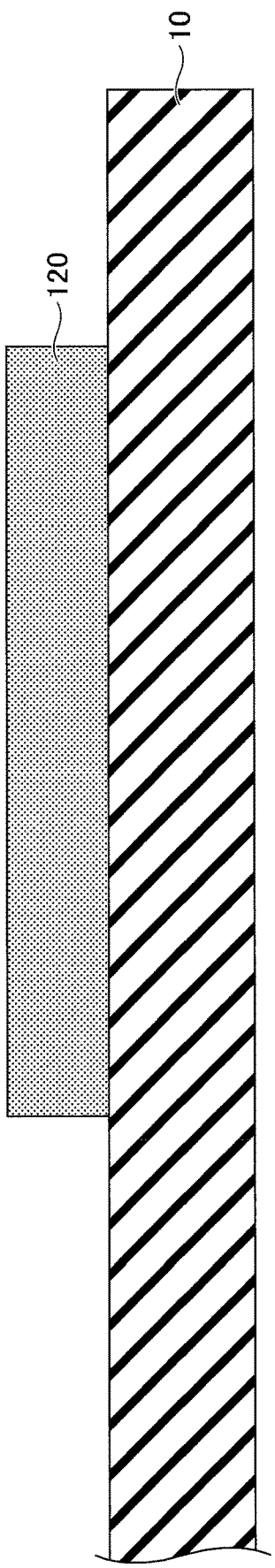
FIGS. 12A and 12B are drawings illustrating a method of manufacturing an optical module according to an embodiment.
Figure 12B:
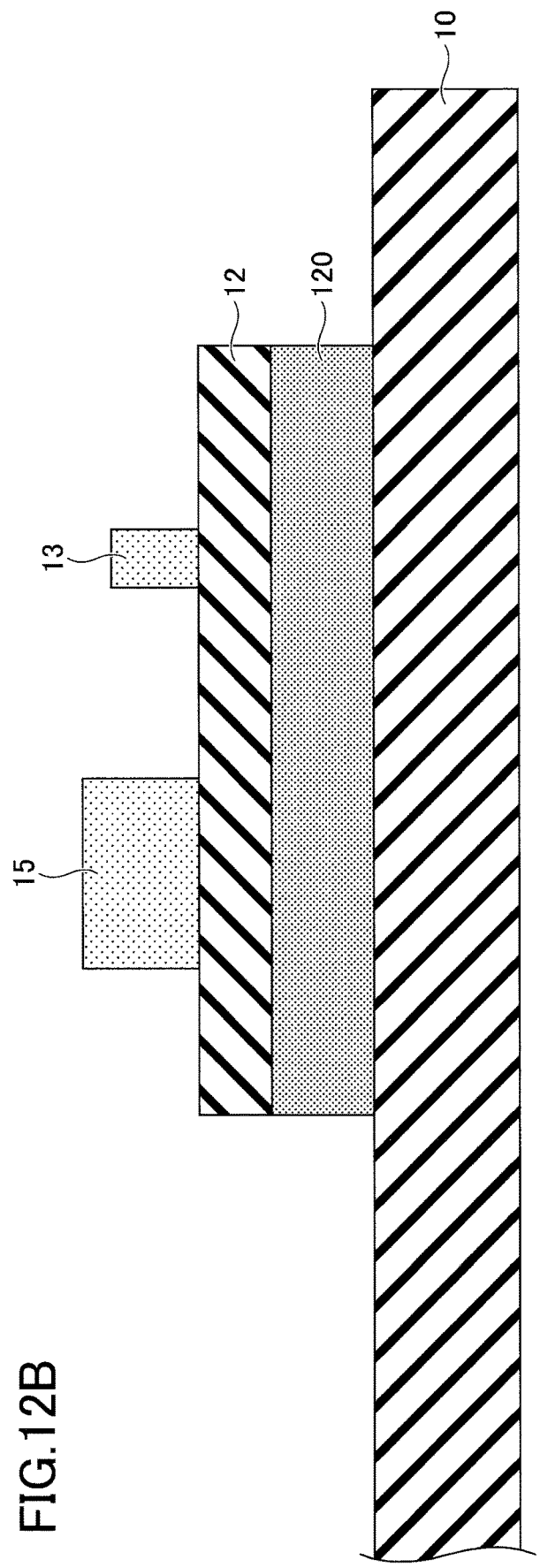

The optical module of the present embodiment may be formed by attaching the absorber 120 to the circuit board 10 as illustrated in FIG. 12A, and by attaching the FPC board 12, on which the light emitter 13, the light receiver 14, the driving IC 15, and the TIA 16 are mounted, to the absorber 120 as illustrated in FIG. 12B. In this process, the absorber 120 is attached to an area on the circuit board 10 that is directly below an area on the FPC board 12 where at least one of the light emitter 13, the light receiver 14, the driving IC 15, and the TIA 16 is mounted. In FIGS. 12A and 12B, the tape 123 is omitted.

Figure 13:
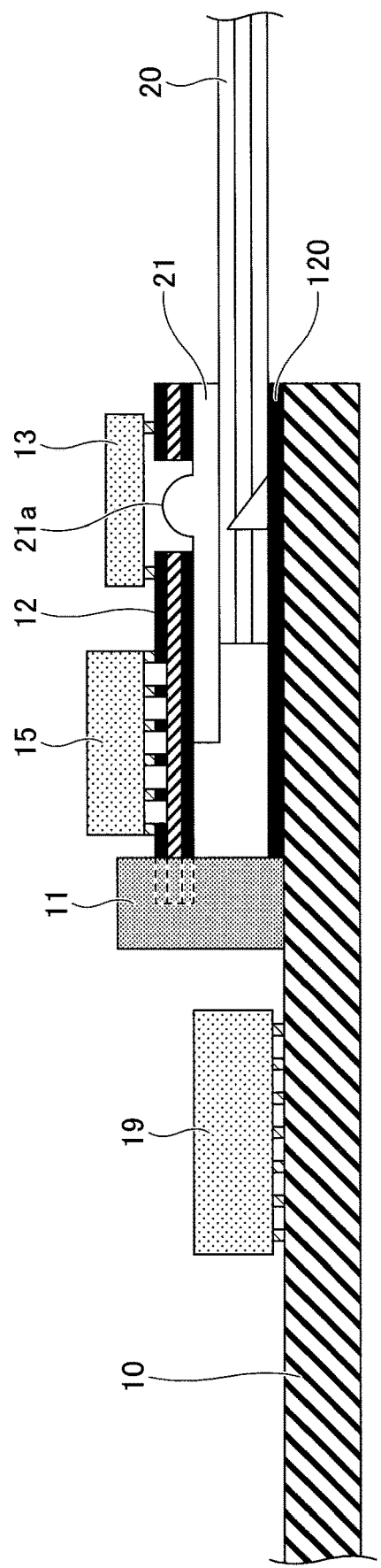
FIG. 13 is a drawing illustrating a configuration of an optical module according to an embodiment.

FIG. 13 is a drawing illustrating a more detailed configuration of the optical module according to the present embodiment. As illustrated in FIG. 13, the optical module includes a lens sheet 21 with multiple lenses 21a and is disposed between the FPC board 12 and the optical waveguide 20. A retimer IC 19 is mounted and wiring (not shown) is formed on the circuit board 10.

In the above embodiment, an optical module is described as an example of a high-frequency module. However, the present invention may also be applied to a high-frequency module using a high-frequency electric signal. Examples of such high-frequency electric signals include electric signals with frequencies in a microwave band between 300 MHz and 3 THz.

A high-frequency module using a high-frequency electric signal may include a first board on which electronic devices such as semiconductor devices operating at a given frequency are mounted, a second board on which wiring and other electronic devices are formed, and the absorber 120 with the slits 120a and disposed between the first board and the second board. In this case, the pitch between the slits 120a is preferably greater than or equal to 0.16λ and less than or equal to 0.41λ, and more preferably greater than or equal to 0.16λ and less than or equal to 0.33λ, where λ indicates wavelength of an electromagnetic wave that may cause noise. In this configuration, the first board may correspond to the FPC board 12, the second board may correspond to the circuit board 10, and the electronic devices mounted on the first board may correspond to the light emitter 13, the light receiver 14, the driving IC 15, and the TIA 16.

An aspect of this disclosure can reduce the influence of noise in a high-frequency module during operation and to prevent the decrease in reception sensitivity of the high-frequency module.

High-frequency modules according to embodiments of the present invention are described above. However, the present invention is not limited to the specifically disclosed embodiments, and variations and modifications may be made without departing from the scope of the present invention.

What is claimed is:

1. A high-frequency module, comprising:
   a first board including an upper surface and a lower surface, an electronic device being mounted on the upper surface of the first board;
   a second board including an upper surface on which at least wiring is formed; and
   a radio-wave absorber disposed between the lower surface of the first board and the upper surface of the second board,
   wherein the radio-wave absorber includes multiple slits formed therein.

2. The high-frequency module as claimed in claim 1, wherein
   the electronic device is configured to operate at a predetermined frequency; and
   the slits are arranged at a pitch greater than or equal to $0.16\lambda$ and less than or equal to $0.41\lambda$, where $\lambda$ indicates a wavelength of the predetermined frequency.

3. The high-frequency module as claimed in claim 1, further comprising:
   a light emitter and a light receiver disposed on the upper surface of the first board;
   a driving circuit disposed on the upper surface of the first board and configured to drive the light emitter; and
   a conversion circuit disposed on the upper surface of the first board and configured to convert an electric current output from the light receiver into a voltage;
   wherein the radio-wave absorber is disposed in an area corresponding to an area on the first board where at least one of the light emitter, the light receiver, the driving circuit, and the conversion circuit is mounted.

* * * * *